United States Patent
Takahashi et al.

(10) Patent No.: US 7,518,233 B1
(45) Date of Patent: Apr. 14, 2009

(54) SEALING STRUCTURE FOR MULTI-CHIP MODULE

(75) Inventors: Kouichi Takahashi, Sagamihara (JP); Kenichi Kasai, Ushiku (JP); Takahiro Daikoku, Ushiku (JP); Takayuki Uda, Hadano (JP); Toshitada Netsu, Hadano (JP); Takeshi Yamaguchi, Hadano (JP); Takahiko Matsushita, Hadano (JP); Osamu Maruyama, Hadano (JP)

(73) Assignees: Hitachi, Ltd., Tokyo (JP); Hitachi Information Technology Co., Ltd., Kanagawa (JP)

( * ) Notice: Subject to any disclaimer, the term of this patent is extended or adjusted under 35 U.S.C. 154(b) by 1589 days.

(21) Appl. No.: 09/590,897

(22) Filed: Jun. 9, 2000

(30) Foreign Application Priority Data

Jun. 9, 1999 (JP) .................................. 11-162046

(51) Int. Cl.
*H01L 23/12* (2006.01)
*H01L 23/10* (2006.01)
*H01L 23/34* (2006.01)
*H01L 23/28* (2006.01)
*H01L 21/00* (2006.01)

(52) U.S. Cl. ........................ 257/704; 257/675; 257/706; 257/707; 257/710; 257/717; 257/718; 257/719; 257/720; 257/722; 257/726; 257/727; 257/796; 438/122

(58) Field of Classification Search .................. 257/723, 257/726, 718, 704, 706, 766, 712, 675, 796; 438/122, 124; 361/704
See application file for complete search history.

(56) References Cited

U.S. PATENT DOCUMENTS 4,381,032 A * 4/1983 Cutchaw ...................... 165/46

(Continued)

FOREIGN PATENT DOCUMENTS

JP 60-046055 * 3/1985

(Continued)

OTHER PUBLICATIONS

IBM Technical disclosure, "Module Probe Package", May 1991, vol. 33 Issue 12 pp. 85-86.*

(Continued)

*Primary Examiner*—Matthew Smith
*Assistant Examiner*—James M Mitchell
(74) *Attorney, Agent, or Firm*—Townsend and Townsend and Crew LLP

(57) ABSTRACT

A sealing structure for multi-chip modules stable in cooling performance and excelling in sealing reliability is to be provided. The under face of a frame 5 compatible with a wiring board 1 in thermal expansion rate is fixed with solder 8 to the face of the wiring board 1 for mounting semiconductor devices 2; a rubber O-ring 15 is placed between the upper face of the frame 5 and the under face of the circumference of an air-cooled: heat sink 7; the plastic member 6 making possible relative sliding is placed between the upper face of the circumference of the heat sink 7 and the upper frame 10; the upper face of a plastic member 6 is restrained with the inside middle stage of an upper frame 10; and the lower part of the upper frame 10 and the frame 5 are fastened together with bolts 9.

4 Claims, 3 Drawing Sheets

U.S. PATENT DOCUMENTS

| | | | |
|---|---|---|---|
| 4,500,945 A * | 2/1985 | Lipschutz | 361/715 |
| 4,654,966 A * | 4/1987 | Kohara et al. | 29/840 |
| 4,730,665 A * | 3/1988 | Cutchaw | 165/80.4 |
| 4,890,903 A * | 1/1990 | Treisman et al. | 359/666 |
| 5,155,661 A * | 10/1992 | Nagesh et al. | 165/80.3 |
| 5,157,588 A * | 10/1992 | Kim et al. | 361/736 |
| 5,268,814 A * | 12/1993 | Yakubowski | 174/16.3 |
| 5,270,262 A * | 12/1993 | Switky et al. | 29/827 |
| 5,276,289 A * | 1/1994 | Satoh et al. | 174/260 |
| 5,323,292 A * | 6/1994 | Brzezinski | 361/689 |
| 5,390,076 A * | 2/1995 | Umezawa | 361/689 |
| 5,455,457 A * | 10/1995 | Kurokawa | 257/704 |
| 5,608,610 A * | 3/1997 | Brzezinski | 361/704 |
| 5,621,615 A * | 4/1997 | Dawson et al. | 165/80.4 |
| 5,844,311 A * | 12/1998 | Watanabe et al. | 257/710 |
| 5,949,137 A * | 9/1999 | Domadia et al. | 257/213 |
| 5,959,353 A * | 9/1999 | Tomita | 257/700 |
| 6,011,304 A * | 1/2000 | Mertol | 257/704 |
| 6,020,597 A * | 2/2000 | Kwak | 257/48 |
| 6,099,597 A * | 8/2000 | Yap et al. | 29/25.01 |
| 6,148,855 A * | 11/2000 | Rauner et al. | 137/560 |
| 6,198,630 B1 * | 3/2001 | Cromwell | 361/704 |
| 6,212,070 B1 * | 4/2001 | Atwood et al. | 165/80.2 |
| 6,329,224 B1 * | 12/2001 | Nguyen et al. | 438/111 |

FOREIGN PATENT DOCUMENTS

JP  08274224  10/1996

OTHER PUBLICATIONS

E. D. Perfecto, et al., "MCM-D/C Application for a High Performance Module," *Proceedings of 1996 International Conference on Multi-chip Modules*, pp. 69-74.

S. K. Ray, et al., "Ceramic Column Grid Array (CCGA) Module for a High Performance Work Station Application," *Proceedings of IEEE 1997 Electronic Components and Technology Conference*, pp. 319-323.

\* cited by examiner

SEALING STRUCTURE FOR MULTI-CHIP MODULE

BACKGROUND OF THE INVENTION

This invention relates to a sealing and cooling mechanism for multi-chip modules, and more particularly to a sealing structure for multi-chip modules formed by hermetically sealing high-performance semiconductor devices over a substrate for use in computers and the like.

Along with the continuing increase in the processing speed and storage capacity of computers, semiconductor devices are increasingly faster and more densely integrated. At the same time, however, the increase in heat emitted by semiconductor devices resulting from their growing power consumption is posing a problem, together with the problem of reliability of stable operation of semiconductor devices. Especially in multi-chip modules wherein a large number of semiconductor devices are mounted over a substrate wired in high density, this increased heating poses a major challenge to configure a satisfactory cooling structure.

On the other hand, to maintain the environmental stability of semiconductor devices and their cooling performance as modules for long periods, how to configure a sealing structure which can hermetically enclose semiconductor devices and He gas for enhancing the efficiency of thermal conduction within multi-chip modules is a major technical problem. One known sealing structure for multi-chip modules is disclosed in, for instance, "MCM-D/C Application for High Performance Module," *Proceedings of 1996 International Conference on Multi-chip Modules*, pp. 69-74.

This sealing structure is described below with reference to FIG. 5. In FIG. 5, a large number of semiconductor devices 12 are mounted over a wiring board 11 consisting of alumina ceramic. On the bottom side of the wiring board 11 are provided input/output pins 13. A cap board 16 consisting of a highly thermally conductive materials, covering the wiring board 11, is fixed to the circumference of the wiring board 13 with solder 18 to hermetically seal the module. Between the semiconductor devices 12 and the cap board 16 is provided a thermally conductive means, known as thermally conductive compounds 14, each matching one or another of the semiconductor devices 12, to transmit the heat emitted by the semiconductor devices 12 to the cap board. Over the top surface of the cap board 16 is fitted an air-cooled heat sink 17 to radiate heat from the semiconductor devices 12 transmitted via the cap board 16.

The above-described sealing structure for multi-chip modules involves several problems of reliability of the sealing connection and cooling performance. In the above-cited structure described in "MCM-D/C Application for High Performance Module," *Proceedings of 1996 International Conference on Multi-chip Modules*, pp. 69-74, highly thermally conductive metals, such as aluminum and copper, are used for the cap and the heat sink to secure satisfactory cooling performance.

On the other hand, a ceramic material, such as alumina ceramic, is used for the wiring board to facilitate fine multi-layered wiring. Because aluminum and copper constitute the cap board or heat sink, and have higher rates of thermal expansion than ceramics, the disparity in thermal expansion between the cap board and heat sink on the one hand and the wiring board on the other hand, widens with an increase in the overall heat emission of the modules and/or in the wiring board size. Because the cap board and the wiring board are fixed with solder in the described structure, deformation in the horizontal direction is constrained with the solder-fixed part as the constraining point as the difference in thermal expansion between the cap board and the wiring board increases.

The quantity of thermal deformation with respect to a module of 150 mm square in size, using aluminum ($24 \times 10^{-6}/°$ C. in thermal expansion coefficient) for the cap and alumina ceramic ($7 \times 10^{-8}/°$ C. in thermal expansion coefficient) for the wiring board is calculated below. Whereas semiconductor devices are usually cooled to keep their temperature at or below 80° C., the temperature of the wiring board then is about 80° C., and that of the cap, around 60° C., though it may vary with the cooling method. Therefore, the relative quantity of thermal deformation against a temperature change from the normal level from the center to a corner of the module can be calculated by the following equation (1):

$$\Delta L = LX(\alpha 1 \cdot \Delta T1 - 1\alpha 2 \cdot \Delta T2) \tag{1}$$

$\Delta L$: Relative quantity of thermal deformation

L: Length of member ($=150/\sqrt{2}$)

$\alpha 1$: Linear expansion coefficient of wiring board ($=7 \times 10^{-6}/°$ C.)

$\Delta T1$: Temperature change of wiring board ($=80-20=60°$ C.)

$\alpha 2$: Linear expansion coefficient of cap ($=24 \times 10^{-6}/.$C)

$\Delta T2$: Temperature change of cap ($=60-20=40°$ C.)

The relative quantity of thermal deformation predicted by using Equation (1) is 57 μm. If this relative quantity in the horizontal direction is constrained, the module will be bent in the vertical direction by a bimetal effect, resulting in an expanding gap between the cap and the wiring board. Thus, the gap in the thermally conductive compound part applied between the cap and the semiconductor devices will increase, deteriorating the cooling performance, making it more difficult to maintain at a satisfactory level. Moreover, as this thermal deformation gives rise to a large stress in the solder-fixed portion as well, the ceramic and/or the solder part may be destroyed, reducing reliability as well.

SUMMARY OF THE INVENTION

The present invention improves the above-noted problematic aspects of the prior art and provides a sealing structure for multi-chip modules, which enhances reliability while providing superior cooling performance. In one embodiment, a structure is provided in which materials subject to significant elastic deformation, such as rubber and plastics, intervene in fastening parts between members differing in thermal expansion. The deformation of these elastic materials absorbs the relative thermal deformation between the members along with variations in temperature. In another embodiment a structure is provided in which smoothly sliding materials, such as plastics, intervene in the fastening part between members differing in thermal expansion and the sliding of these materials absorbs the relative thermal deformation between the members with variations in temperature.

DESCRIPTION OF THE SPECIFIC EMBODIMENTS

Figure 1:
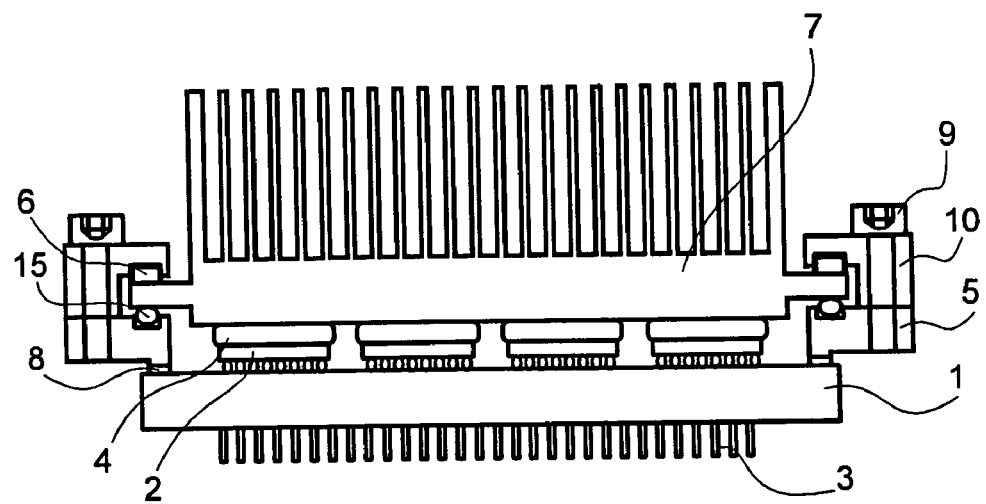
FIG. 1. illustrates a cross section of a sealing and cooling mechanism for multi-chip modules in a first preferred embodiment.

FIG. 1 is a cross section of a sealing structure for multi-chip modules, illustrating the configuration of a first preferred embodiment of the invention. In the structure of FIG. 1, a large number of semiconductor devices 2 are mounted over a wiring board 1 consisting of a ceramic material. The wiring board 1 consists of a material which is compatible with the semiconductor devices 2 in thermal expansion rate. On the bottom side of the wiring board 1 are provided input/output pins 3.

The under face of a frame 5, consisting of a ferronickel alloy which is compatible with the wiring board 3 in thermal expansion rate, is mutually engaged by a solder bond 8 with the face of the wiring board 1 over which the semiconductor devices 2 are mounted.

The upper part of the frame 5 extends outside the wiring board 1, and the upper face of the frame 5 constitutes a flange face in which an O-ring groove is cut. The upper and lower faces of the circumference of an air-cooled heat sink 7, consisting of aluminum, copper or the like, a material incompatible with the frame 5 in thermal expansion rate, constitute flange faces, and a highly elastic rubber O-ring 15 is placed between the under flange face and the upper O-ring-grooved face of the frame 5.

Hermetic sealing is achieved by placing a plastic member 6 excelling in relative sliding ease over the upper face of the circumference of the air-cooled heat sink 7 to restrain the upper face of the plastic member 6 at the inside middle stage of an upper frame 10 and fastening together the lower part of the upper frame 10 and the frame 5 with bolts 9 to squeeze the rubber O-ring 15.

A gap allowing for the precision of assembly and the difference in thermal expansion is provided between the side face of the inside middle stage of the upper frame 10 and that of the circumference of the air-cooled heat sink 7, and a fine gap is provided between the upper face of the frame 5 and the under face of the circumference of the air-cooled heat sink 7 to avoid their contact while maintaining the hermetic sealing provided by the rubber O ring 15. Thus deformation of the module in its vertical direction is restrained by preventing the air-cooled heat sink 7 from constraining relative thermal deformation in the horizontal direction of the upper frame 10, frame 5 and wiring board 1.

Between the air-cooled heat sink 7 and the semiconductor devices 2 are provided thermally conductive compounds 4, each matching one or another of the semiconductor devices 2. By restraining the deformation of the modules in the vertical direction, the spacing of the thermally conductive compounds 4 is kept constant to secure a high level of cooling performance. Further, the stress occurring in the solder bond 8 engaging the frame 5 and the wiring board 1 with each other is reduced, and a high level of connection reliability of the sealing part is thereby secured.

Figure 2:
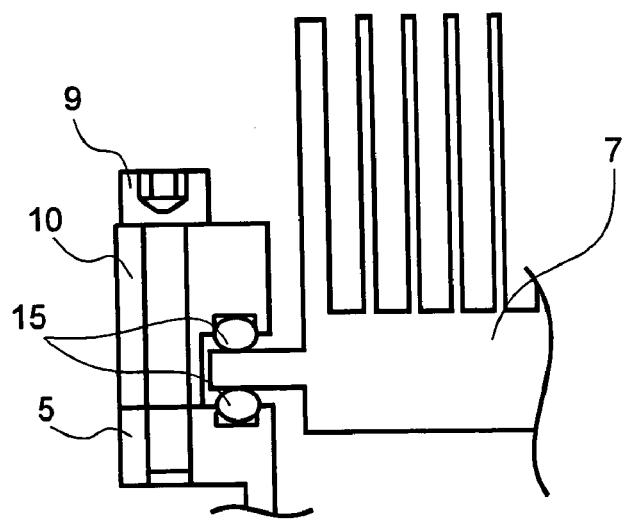
FIG. 2 illustrates a cross section of a sealing and cooling mechanism for multi-chip modules in a second preferred embodiment.

FIG. 2 is a cross section of a sealing structure for multi-chip modules, illustrating the configuration of a second preferred embodiment of the invention. This second embodiment is the same as the first embodiment except that another rubber O-ring 15 is provided over the circumference of the air-cooled heat sink 7 and an O-ring groove is cut into the inside middle stage of the upper frame 10. In other words, the second rubber O-ring 15 is used in place of the plastic member 6 in FIG. 1.

Figure 3:
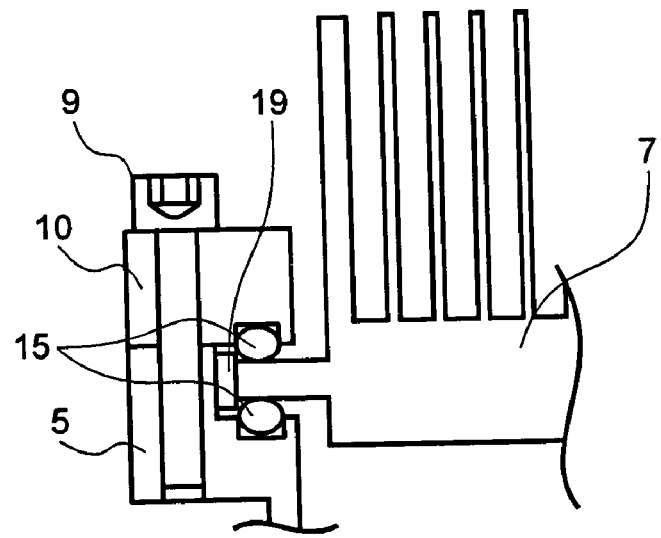
FIG. 3 illustrates a cross section of a sealing and cooling mechanism for multi-chip modules in a third preferred embodiment.

FIG. 3 is a cross section of a sealing structure for multi-chip modules, pertaining to a third preferred embodiment of the invention. In this third embodiment, an O-ring groove is provided in each of the middle stage of the frame 5 and the under face of the upper frame 10, and fastening is accomplished on the circumference of the air-cooled heat sink 7 with bolts 9 via rubber O-rings 15. Further, between the side face of the middle stage of the frame 5 and that of the periphery of the air-cooled heat sink 7, the positioning of the air-cooled heat sink 7 in the horizontal direction is set via a rubber member 19, which is elastic enough to absorb the difference in thermal expansion between the frame 5 and the heat sink 7. This embodiment is the same as the first embodiment, except in these respects.

Figure 4:
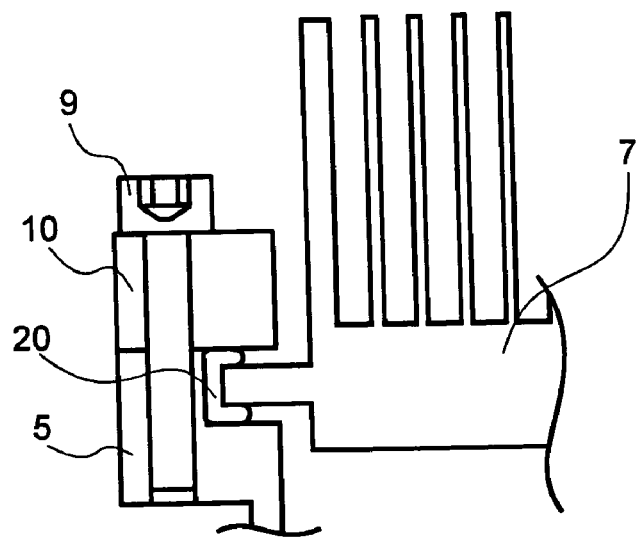
FIG. 4 illustrates a cross section of a sealing and cooling mechanism for multi-chip modules in a fourth preferred embodiment.
Figure 5:
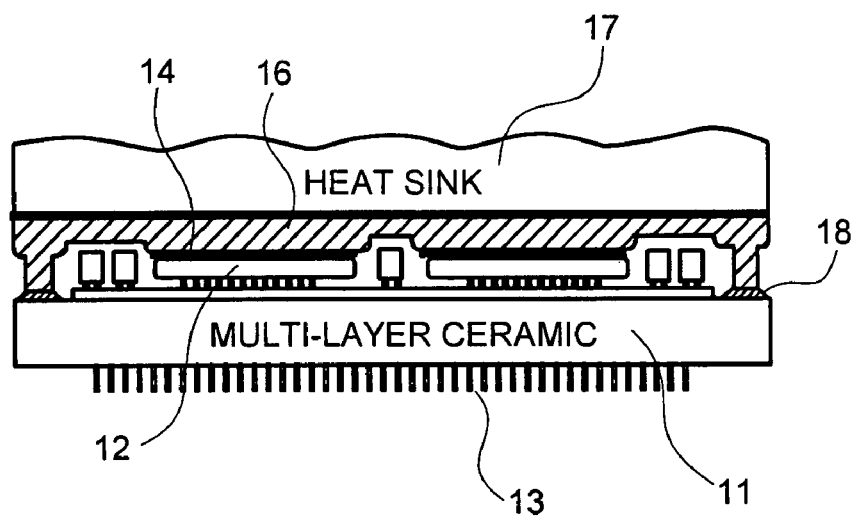
FIG. 5 illustrates a cross section of a sealing and cooling mechanism for multi-chip modules according to the prior art.

FIG. 4 is a cross section of a sealing structure for multi-chip modules, pertaining to a fourth preferred embodiment of the invention. In this fourth embodiment, a highly hermetic and elastic packing 20 is used in place of the rubber O-rings 15 and rubber member 19 in the third embodiment, and the frame is clear of the O-ring groove. In other respects, this embodiment is the same as the third embodiment.

The present invention makes it possible to realize a sealing structure for multi-chip modules which can achieve a high packaging density for semiconductor devices emitting high temperature heat and high reliability for sealing connection.

The preceding has been a description of the preferred embodiment of the invention. It will be appreciated that deviations and modifications can be made without departing from the scope of the invention, which is defined by the appended claims.

What is claimed is:

1. A sealing structure for multi-chip modules comprising:
  a wiring board having one face mounted with a plurality of semiconductor devices and another face having connecting pins arranged thereover;
  a first frame having a thermal expansion coefficient compatible with that of the wiring board, the first frame provided on a periphery of the face of the wiring board mounted with the semiconductor devices;
  a second frame disposed over the first frame;
  a cap having a circumference and having a thermal expansion coefficient different from that of the first and second frames and covering the plurality of semiconductor devices;
  a heat conducting material disposed between the cap and the plurality of semiconductor devices for transmitting heat from the semiconductor devices to the cap;
  an attachment to fix the first frame and the wiring board to each other;
  a fastener for fastening the first and second frames and the cap together via an intervening member,
  the cap being spaced apart from the first and second frames by the intervening member,
  wherein there is an absence of any direct physical contact between the cap and either the first and second frames.

2. A sealing structure for multi-chip modules as in claim 1 wherein O ring grooves are provided in one face of the first frame and one face of the second frame, and the cap is fastened between the first frame and the second frame using at least one O ring.

3. A sealing structure for multi-chip modules as in claim 2 wherein an elastic member is provided between a side face of the cap and a face of the first frame.

4. A sealing structure for multi-chip modules as in claim 1 wherein elastic packing is provided between the first frame and the second frame so as to cover the circumference of the cap.

* * * * *